（12) United States Patent
May et al.

(10) Patent No.: US 10,021,485 B2
(45) Date of Patent: Jul. 10, 2018

(54) PREVENTION OF SIGNAL CLIPPING DUE TO DECREASE IN AMPLIFIER SUPPLY VOLTAGE

(71) Applicant: Cirrus Logic International Semiconductor Ltd., Edinburgh (GB)

(72) Inventors: Jeffrey Allen May, Dripping Springs, TX (US); Firas Azrai, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/342,846

(22) Filed: Nov. 3, 2016

(65) Prior Publication Data

US 2017/0142518 A1 May 18, 2017

Related U.S. Application Data

(60) Provisional application No. 62/256,498, filed on Nov. 17, 2015.

(51) Int. Cl.
*H03G 5/00* (2006.01)
*H04R 3/04* (2006.01)
(Continued)

(52) U.S. Cl.
CPC ............. *H04R 3/04* (2013.01); *H03G 3/007* (2013.01); *H03G 3/3005* (2013.01);
(Continued)

(58) Field of Classification Search
CPC ....................................................... H03G 5/00
See application file for complete search history.

(56) References Cited

U.S. PATENT DOCUMENTS 6,215,288 B1 4/2001 Ramsey et al.
9,391,517 B1 7/2016 Pazhayaveetil et al.
(Continued)

FOREIGN PATENT DOCUMENTS

EP 1798852 A2 6/2007

OTHER PUBLICATIONS

International Search Report and Written Opinion of the International Search Authority, International Application No. PCT/US2016/045818, dated Nov. 7, 2016.
(Continued)

*Primary Examiner* — Olisa Anwah
(74) *Attorney, Agent, or Firm* — Jackson Walker L.L.P.

(57) ABSTRACT

A method may include receiving information indicative of an amplitude of an audio output signal, receiving information indicative of a predicted voltage of a power supply of a signal path having an audio input for receiving an audio input signal and an audio output for generating the audio output signal based on the audio input signal, predicting from the information indicative of the amplitude of the audio output signal and the information indicative of the predicted voltage of the power supply whether the audio output signal will exceed an available supply voltage generated by the power supply, and responsive to determining the audio output signal will exceed the available supply voltage generated by the power supply, attenuating the audio input signal or a derivative thereof to reduce the amplitude of the audio output signal such that the audio output signal does not exceed the available supply voltage of the power supply.

20 Claims, 7 Drawing Sheets

(51) Int. Cl.
*H04R 29/00* (2006.01)
*H03G 7/00* (2006.01)
*H03G 3/00* (2006.01)
*H03G 3/30* (2006.01)

(52) U.S. Cl.
CPC ............ *H03G 7/002* (2013.01); *H03G 7/007* (2013.01); *H04R 29/001* (2013.01)

(56) References Cited

U.S. PATENT DOCUMENTS

| | | |
|---|---|---|
| 2004/0222846 A1 | 11/2004 | Melanson et al. |
| 2005/0100179 A1 | 5/2005 | Behboodian et al. |
| 2012/0177226 A1* | 7/2012 | Silverstein ............ G06F 1/3212 381/107 |
| 2014/0117960 A1 | 5/2014 | Boling |
| 2014/0247029 A1 | 9/2014 | Krabbenborg |
| 2015/0030183 A1 | 1/2015 | Pazhayaveetil et al. |
| 2015/0032396 A1 | 1/2015 | Pazhayaveetil et al. |
| 2015/0229202 A1 | 8/2015 | Varigonda et al. |
| 2015/0381032 A1 | 12/2015 | Li et al. |

OTHER PUBLICATIONS

International Search Report and Written Opinion of the International Search Authority, International Application No. PCT/US2016/061304, dated Jan. 31, 2017.

Definition of "Predict", Merriam-Webster's Collegiate Dictionary (10th Ed.), p. 918 (1993).

* cited by examiner

PREVENTION OF SIGNAL CLIPPING DUE TO DECREASE IN AMPLIFIER SUPPLY VOLTAGE

RELATED APPLICATIONS

The present disclosure claims priority to U.S. Provisional Patent Application Ser. No. 62/256,498, filed Nov. 17, 2015, which is incorporated by reference herein in its entirety.

FIELD OF DISCLOSURE

The present disclosure relates in general to circuits for audio devices, including without limitation personal audio devices such as wireless telephones and media players, and more specifically, to prevention of clipping of an audio signal due to a decrease in amplifier supply voltage.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

In many devices, a boost converter may serve as a power supply to supply a power amplifier with electrical energy for the power amplifier's output stage. As known in the art, a boost converter is a power converter that converts a direct-current voltage, often a voltage output by a battery, to a larger direct-current voltage. Typically, substantially all of the current delivered by the power amplifier to the load (e.g., headphone or speaker) is supplied by the boost converter.

Many static and dynamic methods exist for limiting a boost converter's power consumption of a battery in order to protect a device from consuming too much power or causing a drop in the battery supply voltage down to a level susceptible to browning out a device. However, if the boost converter limits its consumption from the battery in order to protect the battery, the boosted supply voltage generated by the boost converter is likely to lose regulation under heavy loading conditions, thereby creating a reduced supply voltage to a power amplifier or other components of the device. For example, due to the reduced supply voltage, an audio output of the amplifier's output stage may be clipped or the audio signal may be reduced in order to prevent the clipping. Such clipping or reduction of the output signal is often not desired. The output of the boost converter is typically captive to a boosted amplifier integrated circuit itself and does not impact any of the other subsystems on the portable device, or risk the potential of a brownout event to the portable device. Thus, a decrease in boosted supply voltage primarily impacts the amplifier and its ability to properly reproduce an output signal on the boosted amplifier integrated circuit.

An example of limiting input power supply consumption of a boost converter consumption by dynamically adjusting the peak current inductor is provided in U.S. patent application Ser. No. 15/229,616, filed Aug. 5, 2016 and entitled "Adjusting Peak Inductor Current to Limit Supply Input Current" (the "'616 Application"), which is incorporated by reference herein. The limiting of input power supply consumption described in the '616 Application may produce a condition in which a boosted supply voltage output by a boost converter is susceptible to loss of regulation.

SUMMARY

In accordance with the teachings of the present disclosure, one or more disadvantages and problems associated with existing approaches to supplying voltages to a plurality of amplifiers may be reduced or eliminated.

In accordance with embodiments of the present disclosure, a method may include receiving information indicative of an amplitude of an audio output signal, receiving information indicative of a predicted voltage of a power supply of a signal path having an audio input for receiving an audio input signal and an audio output for generating the audio output signal based on the audio input signal, predicting from the information indicative of the amplitude of the audio output signal and the information indicative of the predicted voltage, whether the audio output signal will exceed an available supply voltage generated by the power supply, and responsive to determining the audio output signal will exceed the available supply voltage generated by the power supply, attenuating the audio input signal or a derivative thereof to reduce the amplitude of the audio output signal such that the audio output signal does not exceed the available supply voltage of the power supply.

In accordance with these and other embodiments of the present disclosure, a method may include receiving information indicative of a first amplitude of a first audio output signal generated by a first amplifier integrated circuit based on a first audio input signal, receiving information indicative of a second amplitude of a second audio output signal generated by a second amplifier integrated circuit based on a second audio input signal, receiving information indicative of a condition of a power supply for supplying energy to each of the first amplifier integrated circuit and the second amplifier integrated circuit, predicting from the information indicative of the first amplitude, the information indicative of the second amplitude, and the information indicative of the condition, whether at least one of the first audio input signal and the second audio input signal will exceed an available supply voltage generated by the power supply, and responsive to determining at least one of the first audio input signal and the second audio input signal will exceed the available supply voltage generated by the power supply, attenuating at least one of the first audio input signal or a derivative thereof and the second audio input signal or a derivative thereof such that the first audio output signal and the second audio output signal do not exceed the available supply voltage of the power supply.

In accordance with these and other embodiments of the present disclosure, an integrated circuit may include a first input configured to receive information indicative of an amplitude of an audio output signal, a second input configured to receive information indicative of a predicted voltage of a power supply of a signal path having an audio input for receiving an audio input signal and an audio output for generating the audio output signal based on the audio input signal, and processing circuitry. The processing circuitry may be configured to predict from the information indicative of the amplitude of the audio output signal and the information indicative of the predicted voltage whether the audio output signal will exceed an available supply voltage generated by the power supply, and responsive to determining the audio output signal will exceed the available supply voltage generated by the power supply, attenuate the audio input signal or a derivative thereof to reduce the amplitude of the audio output signal such that the audio output signal does not exceed the available supply voltage of the power supply.

In accordance with these and other embodiments of the present disclosure, an integrated circuit may include a first input configured to receive information indicative of a first amplitude of a first audio output signal generated by a first amplifier integrated circuit based on a first audio input signal, a second input configured to receive information indicative of a second amplitude of a second audio output signal generated by a second amplifier integrated circuit based on a second audio input signal, a third input configured to receive information indicative of a condition of a power supply for supplying energy to each of the first amplifier integrated circuit and the second amplifier integrated circuit, and processing circuitry. The processing circuitry may be configured to predict from the information indicative of the first amplitude, the information indicative of the second amplitude, and the information indicative of the condition whether at least one of the first audio input signal and the second audio input signal will exceed an available supply voltage generated by the power supply, and responsive to determining at least one of the first audio input signal and the second audio input signal will exceed the available supply voltage generated by the power supply, attenuate at least one of the first audio input signal or a derivative thereof and the second audio input signal or a derivative thereof such that the first audio output signal and the second audio output signal do not exceed the available supply voltage of the power supply.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figures 1A, 1B:
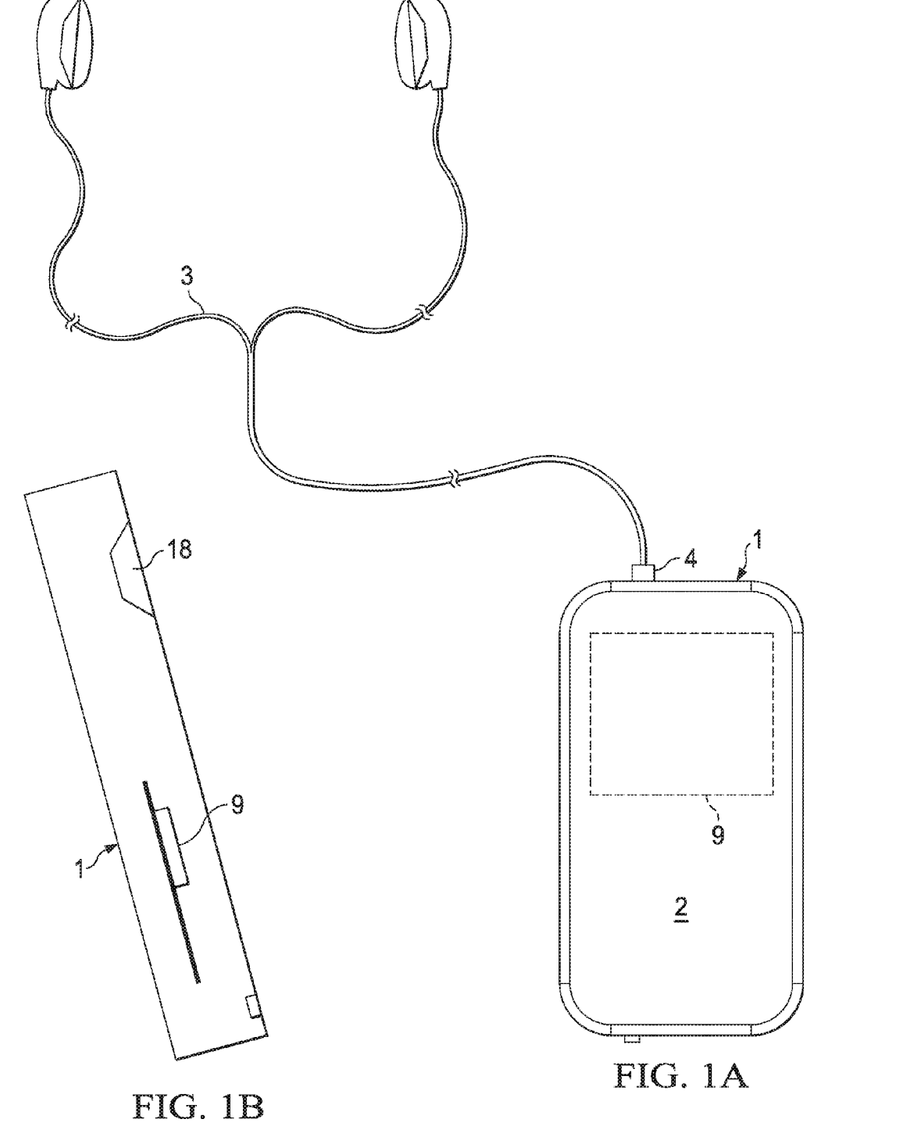
FIG. 1A is an illustration of an example personal audio device, in accordance with embodiments of the present disclosure.
FIG. 1B is an illustration of another example personal audio device, in accordance with embodiments of the present disclosure.

FIG. 1A is an illustration of an example personal audio device 1, in accordance with embodiments of the present disclosure. FIG. 1A depicts personal audio device 1 coupled to a headset 3 in the form of a pair of earbud speakers 8A and 8B. Headset 3 depicted in FIG. 1A is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1A, personal audio device 1 may include an audio integrated circuit (IC) 9 for generating an analog audio signal for transmission to headset 3 and/or another audio transducer.

FIG. 1B is an illustration of another example personal audio device 1, in accordance with embodiments of the present disclosure. FIG. 1B depicts personal audio device 1 having an integrated speaker 18. Speaker 18 depicted in FIG. 1B is merely an example, and it is understood that personal audio device 1 may be used in connection with a variety of audio transducers, including without limitation, headphones, earbuds, in-ear earphones, and external speakers. As also shown in FIG. 1B, personal audio device 1 may include an audio integrated circuit (IC) 9 for generating an analog audio signal for transmission to headset 3 and/or another audio transducer.

Figure 2:
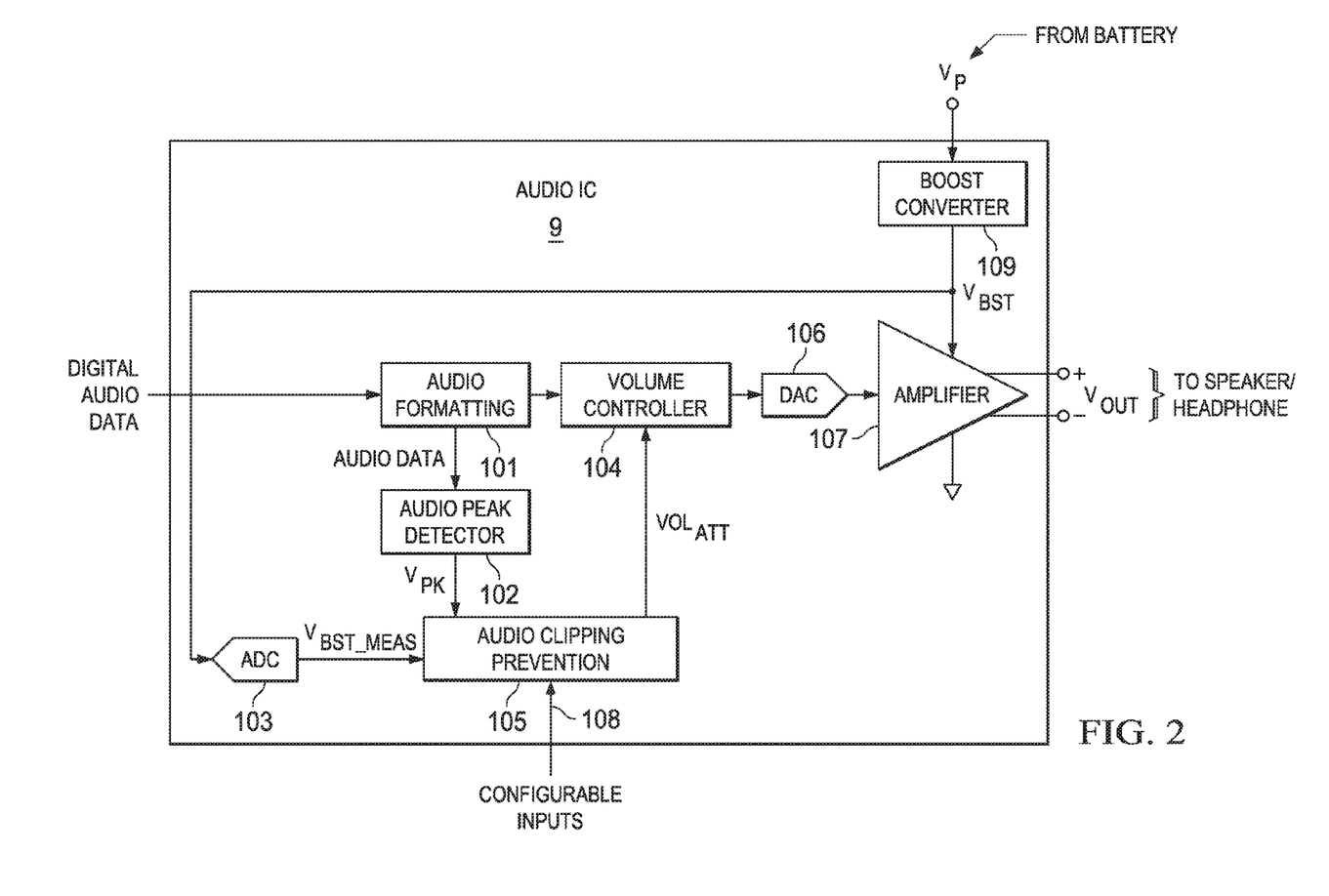
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. As shown in FIG. 2, audio IC 9 may include an audio formatting block 101, an audio peak detector 102, an analog-to-digital converter (ADC) 103, a volume controller 104, audio clipping prevention subsystem 105, a digital-to-analog converter (DAC) 106, amplifier 107, and a boost converter 109.

Boost converter 109 may receive a voltage $V_P$ from a battery or other voltage supply, and may increase the voltage $V_P$ to a boost voltage $V_{BST}$ that may be used to supply electrical energy to amplifier 107 to enable amplifier 107 to generate at its output an output voltage signal $V_{OUT}$ which an amplified version of a signal received at its input.

Audio formatting block 101 may comprise any system, device, or apparatus configured to convert an incoming stream of digital audio data into a format in which the other components of audio IC 9 (e.g., volume controller 104, DAC 106, audio peak detector 102) are capable of processing. For example, audio formatting block 101 may convert a single-bit pulse density modulation signal into multi-bit data.

Audio peak detector 102 may monitor incoming audio data (e.g., as formatted by audio formatting block 101) for peaks in the audio data and output a signal $V_{PK}$ representative of a peak magnitude of output voltage signal $V_{OUT}$ generated by amplifier 107, including any volume and/or gain applied in either the digital or analog domains of the signal path of the audio signal. Audio peak detector 102 may convert audio data to signal $V_{PK}$ in real-time with minimal processing delay or, if an audio buffer is being utilized, then audio peak detector 102 may read the contents or independently keep track of the converted values held in the buffer in order to determine and track signal peaks as audio signals enter and leave such buffer.

ADC 103 may comprise any suitable system, device, or apparatus configured to convert an analog signal into a corresponding digital signal. In particular, as implemented in audio IC 9, ADC 103 may convert boost voltage $V_{BST}$ into a digital signal $V_{BST\_MEAS}$ indicative of boost voltage $V_{BST}$.

Volume controller 104 may comprise any suitable system, device, or apparatus configured to, responsive to a control signal $VOL_{ATT}$, increase or decrease magnitude of an audio signal in an audio path between the audio input of audio IC 9 and the output of amplifier 107. In some embodiments, it may be desirable that volume controller 104 be located in the audio path as far downstream in the path as possible in order to minimize propagation delay from volume controller 104 to the output of amplifier 107, as such propagation delay may directly impact a time from when a volume attenuation is applied by volume controller 104 to the time the attenuated audio reaches the output of amplifier 107. Although FIG. 2 depicts volume controller 104 as a digital volume controller, in some embodiments, volume controller 104 may be implemented in the analog domain (e.g., prior to or integrated within amplifier 107).

DAC 106 may comprise any suitable system, device, or apparatus configured to convert a digital signal received at its input to a corresponding analog signal. Amplifier 107 may comprise any suitable system, device, or apparatus configured to amplify an analog signal received at its input to generate audio output signal $V_{OUT}$ for reproduction at a speaker or headphone (e.g., one of headphones 8A or 8B or speaker 18). In some embodiments, DAC 106 may be integrated within amplifier 107.

Audio clipping prevention subsystem 105 may comprise any suitable system, device, or apparatus configured to receive signal $V_{PK}$, signal $V_{BST\_MEAS}$, and/or configurable inputs 108 as inputs and based therein, determine whether audio attenuation needs to be applied in order to avoid clipping of audio output signal $V_{OUT}$. If attenuation is to be applied, audio clipping prevention subsystem 105 may employ a state machine which controls an attenuation signal $VOL_{ATT}$ communicated to volume controller 104. Such state machine may have three states:

State 1—Attack—Conditions indicate an error condition in which clipping may occur and attenuation as indicated by attenuation signal $VOL_{ATT}$ is increased per one or more parameters set forth in configurable inputs 108.

State 2—Wait—Conditions indicate the error condition is no longer present, thus the attack state is exited, and attenuation as indicated by attenuation signal $VOL_{ATT}$ remains static.

State 3—Release—Conditions indicate the error condition is no longer present, thus the wait state is exited, and attenuation as indicated by attenuation signal $VOL_{ATT}$ is decreased per one or more parameters set forth in configurable inputs 108.

In performing the functionality described herein, audio clipping prevention subsystem 105 may operate to maintain a required voltage headroom between audio output signal $V_{OUT}$ and the boost voltage $V_{BST}$ in order to avoid clipping of audio output signal $V_{OUT}$ by the output stage of amplifier 107. Thus, it may be necessary to trigger the error conditions based on the voltage headroom plus the peak audio signal as indicated by signal $V_{PK}$ and not based on just signal $V_{PK}$ itself.

Any attenuation applied by audio clipping prevention subsystem 105 must, from a practical standpoint, take a finite amount of time to be applied due to system response, propagation delay, bandwidth of amplifier 107, and/or other causes. Additional time may also be required to gracefully attenuate an audio signal so as to reduce the audibility of attenuation. Furthermore, the system implemented by audio IC 9 may require an appreciable amount of time to monitor the boost voltage $V_{BST}$ as indicated by signal $V_{BST\_MEAS}$. Accordingly, audio clipping prevention subsystem 105 may always be responding to behavior of boost voltage $V_{BST}$ which has occurred in the past. Accordingly, audio clipping prevention subsystem 105 may predict based on signals $V_{BST\_MEAS}$ and $V_{PK}$ whether the boost voltage $V_{BST}$ and audio output signal $V_{OUT}$ will intersect so as to indicate an error condition of likely signal clipping.

While audio clipping prevention subsystem 105 may have advanced information of audio content of digital audio data prior to an audio signal propagating to the output of amplifier 107 (especially where the audio data is buffered), boost voltage $V_{BST}$ may only be measured as it occurs. The digitization of boost voltage $V_{BST}$ into digital signal $V_{BST\_MEAS}$ by ADC 103 may not be instantaneous. Instead, it may take some time for the analog boost voltage $V_{BST}$ voltage to be (potentially) filtered, sampled, and digitized by ADC 103. Accordingly, at any given point in time the boost voltage $V_{BST}$ represented by digital signal $V_{BST\_MEAS}$ and provided to clipping prevention subsystem 105 may be older than the actual boost voltage $V_{BST}$ provided to the amplifier 107. When boost voltage $V_{BST}$ is decreasing, this time delay can produce a source of error between digital signal $V_{BST\_MEAS}$ to which clipping prevention 105 subsystem is responding and boost voltage $V_{BST}$ available to amplifier 107. If this disconnect between the actual boost voltage $V_{BST}$ and measured boost voltage represented by digital signal $V_{BST\_MEAS}$ is not mitigated, it can cause clipping prevention subsystem 105 to either overreact (e.g., by over-attenuating the audio signal) or underreact (e.g., amplifier 107 still clips audio output signal $V_{OUT}$). Accordingly, audio clipping prevention subsystem 105 may take into consideration the time rate of change of boost voltage $V_{BST}$ in addition to the instantaneous magnitude of boost voltage $V_{BST}$ in order to determine whether audio output signal $V_{OUT}$ is likely to be clipped by a decreasing boost voltage $V_{BST}$.

Figure 3:
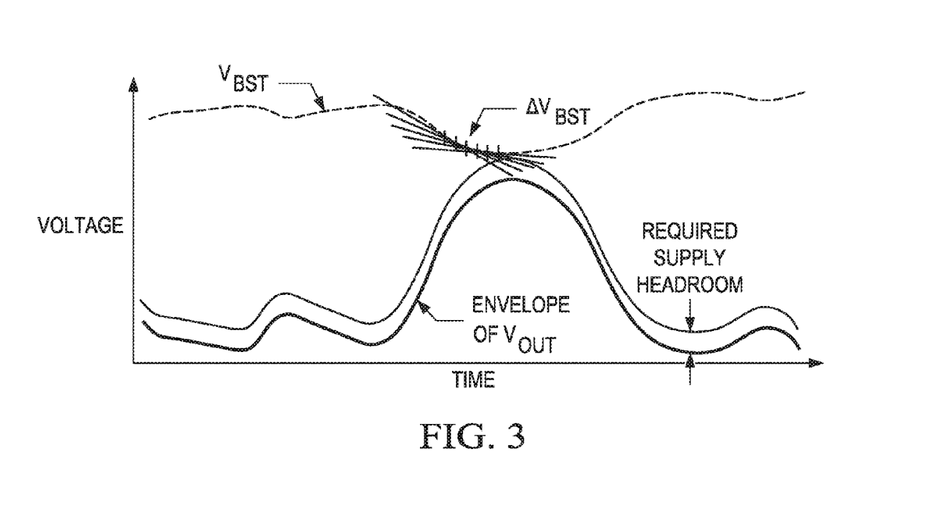
FIG. 3 illustrates a graph showing an example in which a rate of decrease of a boost voltage decreases and flattens out as an audio envelope audio output signal approaches the boost voltage, in accordance with embodiments of the present disclosure.
Figure 4:
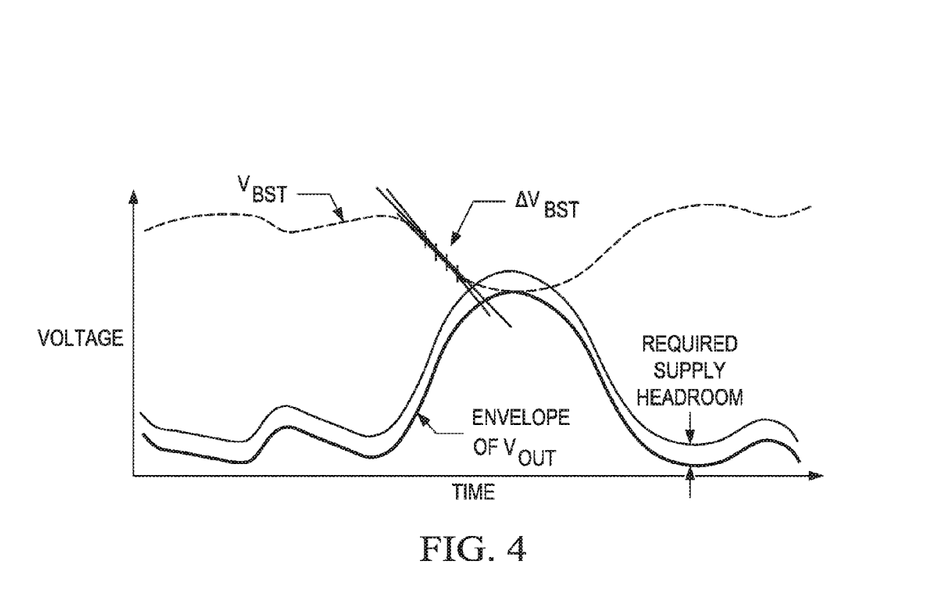
FIG. 4 illustrates a graph showing an example in which a boost voltage decreases rapidly in the presence of an increasing audio output signal such that, left unattenuated, audio output signal $V_{OUT}$ will be clipped by the decreasing boost voltage, in accordance with embodiments of the present disclosure.

To illustrate, FIG. 3 illustrates a graph showing an example in which a rate of decrease of boost voltage $V_{BST}$ decreases and flattens out as an audio envelope audio output signal $V_{OUT}$ approaches boost voltage $V_{BST}$. In this example, because the rate of decrease of boost voltage $V_{BST}$ decrease flattens out prior to boost voltage $V_{BST}$ intersecting with the required supply headroom audio output signal $V_{OUT}$, attenuation may not be necessary. On the other hand, FIG. 4 illustrates a graph showing an example in which boost voltage $V_{BST}$ decreases rapidly in the presence of an increasing audio output signal $V_{OUT}$ such that, left unattenuated, audio output signal $V_{OUT}$ will be clipped by the decreasing boost voltage $V_{BST}$. Accordingly, if only the magnitude of boost voltage $V_{BST}$ is taken into account, by the time the level of boost voltage $V_{BST}$ causing clipping is measured, audio clipping prevention subsystem 105 may not have adequate time to respond to prevent clipping unless significant guard-banding was applied. However, such guard-banding would mean that the audio signal may be attenuated more often than is necessary to prevent clipping. Thus, audio clipping prevention subsystem 105 may leverage a time rate of change in the magnitude of boost voltage $V_{BST}$ in order to determine a rate of audio attenuation necessary in order to prevent audio clipping without overly attenuating the audio signal.

As mentioned above and shown in FIG. 2, audio clipping prevention subsystem 105 may receive one or more configurable inputs 108. Configurable inputs 108 may be configured by a user of a personal audio device comprising audio IC 9 or by a designer/manufacturer of a personal audio device comprising audio IC 9. Configurable inputs 108 may allow for flexibility in different types of system requirements. Configurable inputs 108 may include, without limitation, parameters for controlling one or more of: a time period between consecutive attack steps of audio clipping prevention subsystem 105, an amount of audio attenuation to apply per attack time period, a time period to wait between exiting an attack state and entering a release state of audio clipping prevention subsystem 105, a time period between consecutive releasing steps, an amount of audio attenuation to remove per release time period, a number of voltage thresholds to apply to a change in audio attenuation, a definition of how a decrease in boost voltage $V_{BST}$ triggers changes in an audio attenuation rate, and a voltage supply headroom target that audio clipping prevention subsystem 105 may target or maintain to avoid clipping in amplifier 107.

FIG. 2 depicts an integrated architecture in which boost converter 109 is integral to audio IC 9. However, in certain embodiments of the present disclosure, boost converter 109 may be external to (e.g., instantiated on another integrated circuit separate from) audio IC 9 in a distributed architecture. Other distributed architecture embodiments may exist in which two or more amplifier integrated circuits share a common boost converter on one of the amplifiers or on a separate integrated circuit. The integrated circuit comprising the boost converter in a distributed architecture may provide a boosted supply voltage to the two or more amplifier integrated circuits.

Because the distributed architecture has a boost converter integrated circuit and two or more amplifier integrated circuits, a distributed architecture system may require synchronization in communication and signal processing among the two or more amplifier integrated circuits in order to perform the audio clipping prevention described herein. An example of such synchronization among multiple devices in a distributed network may be provided in U.S. patent application Ser. No. 15/226,197, filed Aug. 2, 2016 and entitled "Multi-Device Synchronization of Devices" (the "'197 Application") which is incorporated by reference herein.

Figure 5:
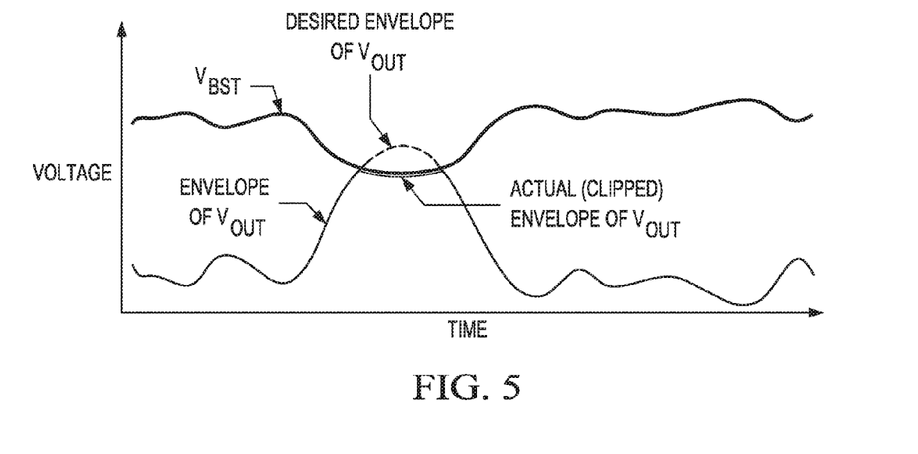
FIG. 5 illustrates a graph showing an example of a mono audio output signal in the presence of a poorly-regulated boost voltage such that the audio output signal is clipped under peak loading conditions without intervention from an audio clipping prevention subsystem, in accordance with embodiments of the present disclosure.

To further illustrate the functionality of audio clipping prevention subsystem 105, various examples of signal waveforms and example responses of audio clipping prevention subsystem 105 to such waveforms are described below. For example, FIG. 5 illustrates a graph showing an example of a mono (e.g., single-channel) audio output signal $V_{OUT}$ in the presence of a poorly-regulated boost voltage $V_{BST}$ such that audio output signal $V_{OUT}$ is clipped under peak loading conditions, in accordance with embodiments of the present disclosure. In the example of FIG. 5, the desired audio output signal $V_{OUT}$ cannot be achieved due to the poorly-regulated boost voltage $V_{BST}$, and the actual audio output signal $V_{OUT}$ is clipped and limited by boost voltage $V_{BST}$. Such clipping may produce undesirable audio artifacts, negatively impacting the user experience.

Figure 6:
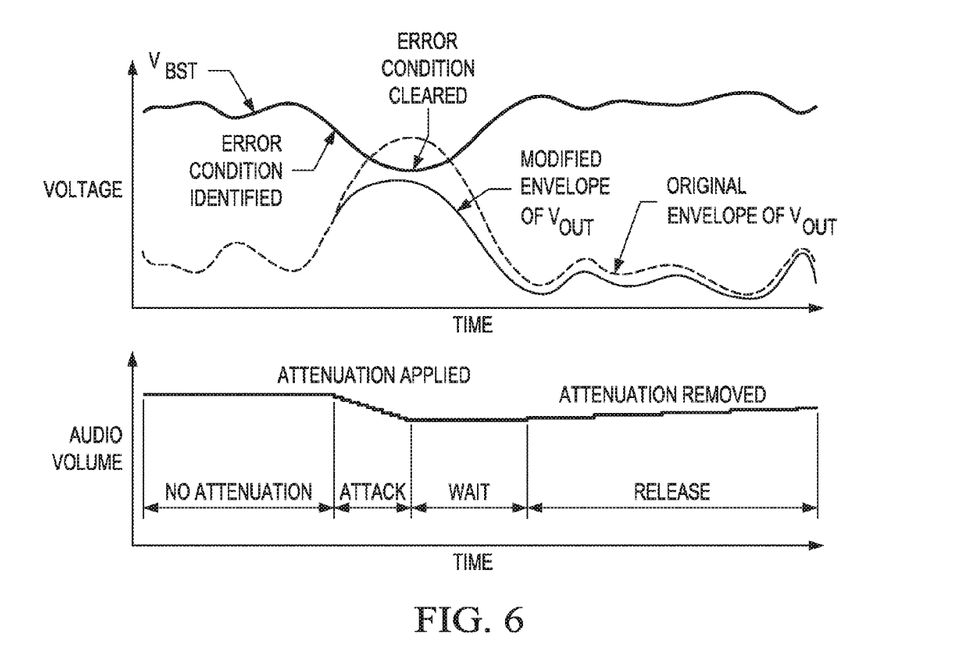
FIG. 6 illustrates a graph showing an example of a mono audio output signal which would have otherwise been clipped without intervention from an audio clipping prevention subsystem, in accordance with embodiments of the present disclosure.

FIG. 6 illustrates a graph showing an example of a mono (e.g., single-channel) audio output signal $V_{OUT}$ which would have otherwise been clipped without intervention from audio clipping prevention subsystem 105, thus demonstrating the response of audio clipping prevention subsystem 105, in accordance with embodiments of the present disclosure. As shown in FIG. 6, audio clipping prevention subsystem 105 may respond to the decreasing boost voltage $V_{BST}$ and the increasing envelope of audio output signal $V_{OUT}$ by attenuating audio output signal $V_{OUT}$ prior to the clipping event. The example of FIG. 6 may be representative of a fast-attack, slow-release response. Alternatively, a fast-attack, fast-release response may also be implemented, effectively acting like a peak signal compressor of audio output signal $V_{OUT}$. Audio clipping prevention subsystem 105 may select the response applied (e.g., fast-attack, slow-release versus fast-attack, fast-release) based on configurable inputs 108. If boost voltage $V_{BST}$ increases, then a slow-release response may aid audio clipping prevention subsystem 105 to settle at a "natural" attenuation level but at the cost of average output power from amplifier 107. Conversely, a fast-release response may maintain more average output power in regions of operation in which audio output signal $V_{OUT}$ is not in danger of clipping, but would end up producing more signal shaping/manipulation of the audio peaks of audio output signal $V_{OUT}$.

Figure 7:
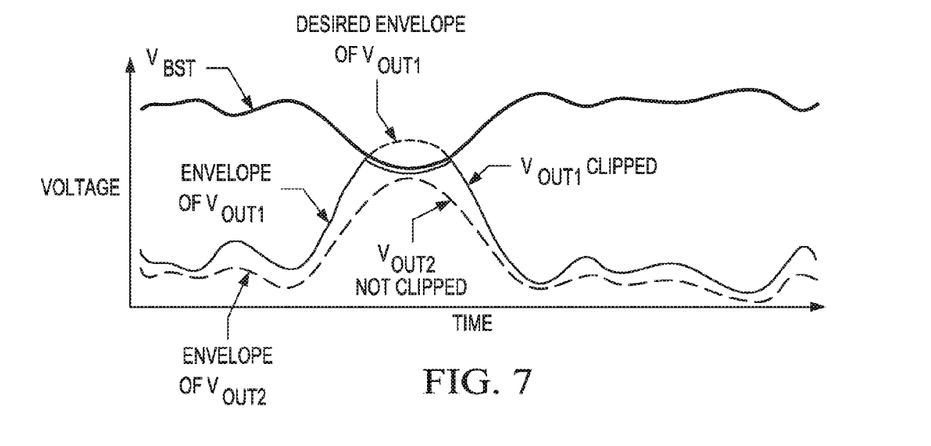
FIG. 7 illustrates a graph showing an example of stereo audio output signals in the presence of a poorly-regulated boost voltage shared by two audio amplifiers for respectively generating the audio output signals such that one of the audio output signals is clipped under peak loading conditions, in accordance with embodiments of the present disclosure.

FIG. 7 illustrates a graph showing an example of stereo (e.g., dual-channel) audio output signals $V_{OUT1}$ and $V_{OUT2}$ in the presence of a poorly-regulated boost voltage $V_{BST}$ shared by two audio amplifiers for respectively generating audio output signals $V_{OUT1}$ and $V_{OUT2}$ such that one of the audio output signals (e.g., $V_{OUT1}$) is clipped under peak loading conditions, in accordance with embodiments of the present disclosure. The sharing of boost voltage $V_{BST}$ arrangement means that a boost converter generating boost voltage $V_{BST}$ must be capable of sourcing both audio amplifiers that respectively generate audio output signals $V_{OUT1}$ and $V_{OUT2}$. In the example of FIG. 7, due to the signal content differences between the two audio amplifiers, only audio output signal $V_{OUT1}$ is clipped while audio output signal $V_{OUT2}$ is not clipped.

In some instances, the audio amplifier generating audio output signal $V_{OUT2}$ may have been intentionally designed to have a lower-magnitude audio signal than the audio amplifier generating audio output signal $V_{OUT1}$. Thus, in such an instance, it may be necessary when attenuating audio output signal $V_{OUT1}$ to avoid clipping to maintain the amplitude relationship between audio output signal $V_{OUT1}$ and audio output signal $V_{OUT2}$. For example, if the one audio amplifier is driving the bass frequencies of a two-speaker system and the other audio amplifier is driving the higher-frequency content, their amplitude relationship must be matched in order to maintain the acoustic tuning relationship. Accordingly, the two amplifiers may communicate between each other if any signal attenuation is being applied to either channel (e.g., as described in the '197 Application), as the attenuation should be matched for both channels. Such two-channel attenuation approach may be expanded further to a system with greater than two channels (e.g., a three-channel system, four-channel system).

Figure 8:
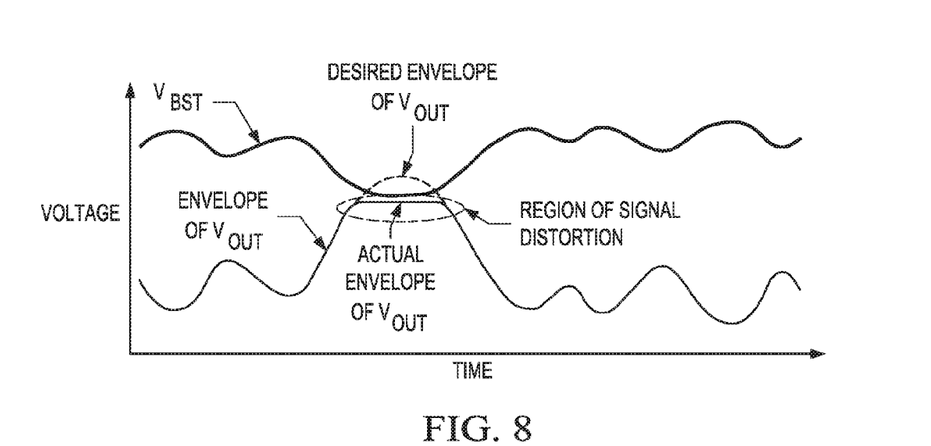
FIG. 8 illustrates a graph showing an example of an audio output signal in the presence of a poorly-regulated boost voltage such that the audio output signal is clipped under peak loading conditions without intervention from an audio clipping prevention subsystem, in accordance with embodiments of the present disclosure.

In some instances, attenuation/compression of an audio output signal by audio clipping prevention subsystem 105 may reduce loading of boost voltage $V_{BST}$, potentially allowing boost voltage $V_{BST}$ an opportunity to recover or droop less severely relative to where it would have if no loading reduction would have occurred. For example, FIG. 8 illustrates a graph showing an example of an audio output signal $V_{OUT}$ in the presence of a poorly-regulated boost voltage $V_{BST}$ such that audio output signal $V_{OUT}$ is clipped under peak loading conditions, in accordance with embodiments of the present disclosure. In the example of FIG. 8, the desired audio output signal $V_{OUT}$ cannot be achieved due to the poorly-regulated boost voltage $V_{BST}$, and the actual audio output signal $V_{OUT}$ is clipped and limited by boost voltage $V_{BST}$.

Figure 9:
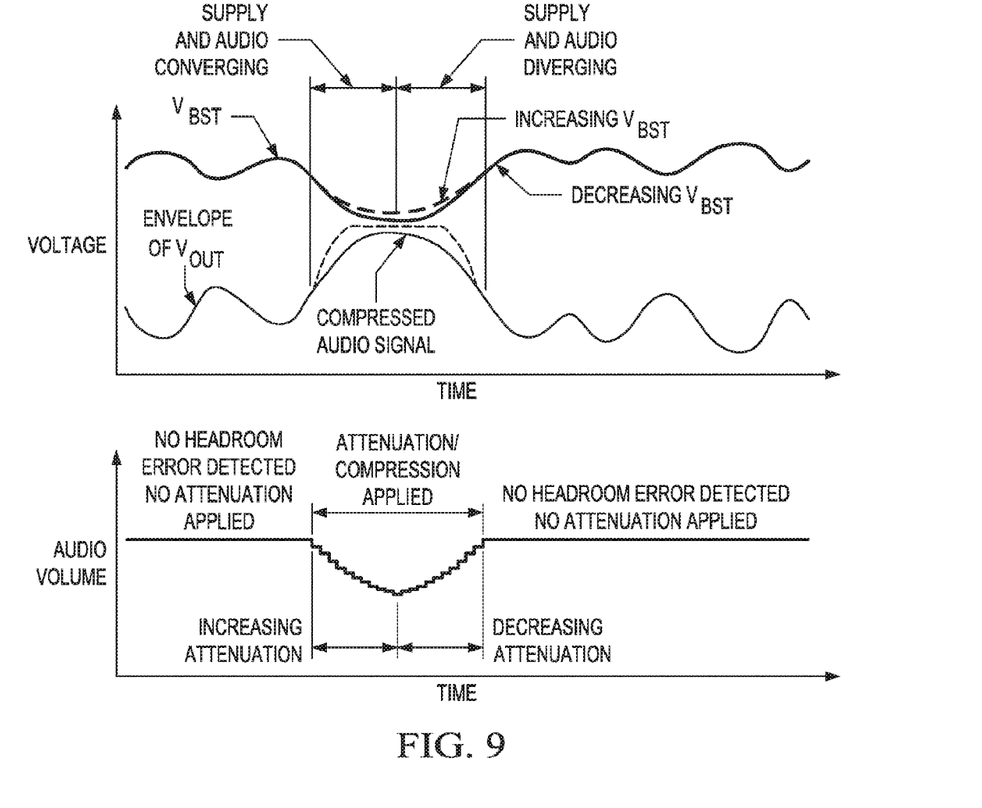
FIG. 9 illustrates a graph showing an example of an audio output signal which would have otherwise been clipped without intervention from an audio clipping prevention subsystem, in accordance with embodiments of the present disclosure.

FIG. 9 illustrates a graph showing an example of a mono (e.g., single-channel) audio output signal $V_{OUT}$ which would have otherwise been clipped without intervention from audio clipping prevention subsystem 105, thus demonstrating the response of audio clipping prevention subsystem 105, in accordance with embodiments of the present disclosure. As shown in FIG. 9, audio clipping prevention subsystem 105 may respond to the decreasing boost voltage $V_{BST}$ and the increasing envelope of audio output signal $V_{OUT}$ by attenuating audio output signal $V_{OUT}$ prior to the clipping event. As shown in FIG. 9, when the audio signal is compressed or attenuated in order to prevent or control the output signal clipping, the loading from amplifier 107 on boost voltage $V_{BST}$ supply may be reduced. The reduction in loading may provide boost voltage $V_{BST}$ an opportunity to recover or decrease less severely relative to where it would have if no loading reduction would have occurred. As the decrease in boost voltage $V_{BST}$ is reduced, audio clipping prevention subsystem 105 may identify the slowing rate of decrease of boost voltage $V_{BST}$, which may in turn provide an opportunity to reduce the rate of increase of attenuation of audio output signal $V_{OUT}$, thereby maintaining as much output power for amplifier 107 as boost voltage $V_{BST}$ can supply without amplifier 107 clipping audio output signal $V_{OUT}$ in an uncontrolled manner. As boost voltage $V_{BST}$ and audio output signal $V_{OUT}$ diverge, the attenuation may be reduced and normal operation can resume with no signal attenuation being present.

Signal attenuation of audio output signal $V_{OUT}$ may be typically performed at the input of the amplifier (or earlier in the audio path), prior to amplification. Accordingly, there may be a small period of time from when the initial attenuation/compression is applied to the audio signal to the time when audio output signal $V_{OUT}$ changes in response to the attenuation. There may also be an additional period of time from when audio output signal $V_{OUT}$ changes to when the loading on boost voltage $V_{BST}$ changes in response to the change in audio output signal $V_{OUT}$ and boost voltage $V_{BST}$ begins to recover due to the reduced loading of amplifier 107 on boost voltage $V_{BST}$. The recovery of boost voltage $V_{BST}$ may mean that there could be a reduction in the rate of change of decrease of boost voltage $V_{BST}$ or that boost voltage $V_{BST}$ could begin increasing. If audio clipping prevention subsystem 105 determines there is not sufficient margin to release the attenuation, audio clipping prevention subsystem 105 may need to perform such release in a manner that also takes into account the rate of change of audio output signal $V_{OUT}$, the delays associated with the recovery of boost voltage $V_{BST}$, and the delays between where attenuation is applied relative to the output of amplifier 107. Thus, audio clipping prevention subsystem 105 may implement a closed loop system that responds to both change in boost voltage $V_{BST}$ and change in audio output signal $V_{OUT}$. Due to the delays that reside within such feedback loop, audio clipping prevention subsystem 105 may need to carefully consider how aggressively attenuation can be applied or removed from audio output signal $V_{OUT}$ relative to time. Accordingly, in order to support a variety of systems with different power supply bandwidths, amplifier bandwidths, audio signal group delays, and boost voltage $V_{BST}$ monitoring group delays, the loop response must be configurable, and such configuration may be undertaken through setting of configurable inputs 108.

In some embodiments, one of the configurable inputs 108 may be a setting indicative of a maximum allowable distortion of audio output signal $V_{OUT}$, such that audio clipping prevention subsystem 105 may predict from information indicative of the amplitude of the audio output signal (e.g., signal $V_{PK}$), the information indicative of a predicted boost voltage $V_{BST}$ (e.g., $V_{BST\_MEAS}$), and the information indicative of the maximum allowable distortion, whether the audio output signal will violate the maximum allowable distortion. For systems utilizing lower quality speakers and/or lower quality power supplies, it may be desirable to allow a certain amount of audio clipping prior to attenuating the audio signal. This may have the benefit of improving the electrical power consumption profile of an amplifier relative to the power supply or battery without significantly impacting the perceived audio quality.

A common metric for audio quality is a total harmonic distortion (THD) ratio, wherein the ratio is relative to the signal amplitude (e.g., amplitude of audio output signal $V_{OUT}$) itself. Often the acoustical distortion produced by a lower quality speaker in a portable device (e.g., a microspeaker) masks some of the electrical distortion produced by an amplifier. However, this is limited based on the speaker. For example, one speaker may be able to mask up to seven percent of electrical THD from an amplifier without producing an acoustic impact, but a different speaker may be of higher quality and only able to mask up to three percent of electrical THD from the amplifier without noticeably impacting the acoustic audio quality.

Accordingly, it is not always necessary to produce an unclipped electrical signal, and a certain amount of distortion may be acceptable in order to lessen the burden on the power supply or battery of a portable device, or deliver more total power to the load. The power delivered to a speaker when clipping is not just a function of a fundamental audio tone, but also includes the energy produced by the harmonics of the fundamental audio tone. Allowing the signal to be clipped may produce a larger RMS power delivery to the load for a given supply voltage, translating into more loudness at the speaker.

For example, turning again to FIG. 2, the ability of amplifier 107 to deliver power to its load and consume power from boost converter 109 may primarily be a function of an impedance of load and boost voltage $V_{BST}$. If boost converter 109 is configured to only allow a certain amount of inductor current through an inductor internal to boost converter 109 or a certain amount of current from its battery supply, the output power of boost converter 109 may be limited. Thus, if amplifier 107 demands more power than boost converter 109 can provide, boost voltage $V_{BST}$ may decrease. As mentioned above, when audio output signal $V_{OUT}$ and boost voltage $V_{BST}$ converge, a clipping event may occur. Typical existing approaches include limiting the power delivery of amplifier 107 based on a worst-case clipping scenario. However, limiting the power delivery through amplifier 107 is done at the cost of power delivery (thus decreasing loudness) and output signal distortion across its operating conditions (e.g., a fully-charged vs. weak battery supply). Without managing the signal reproduction at the output, such traditional battery power management can produce inconsistent audio performance across all operational conditions.

Figure 10:
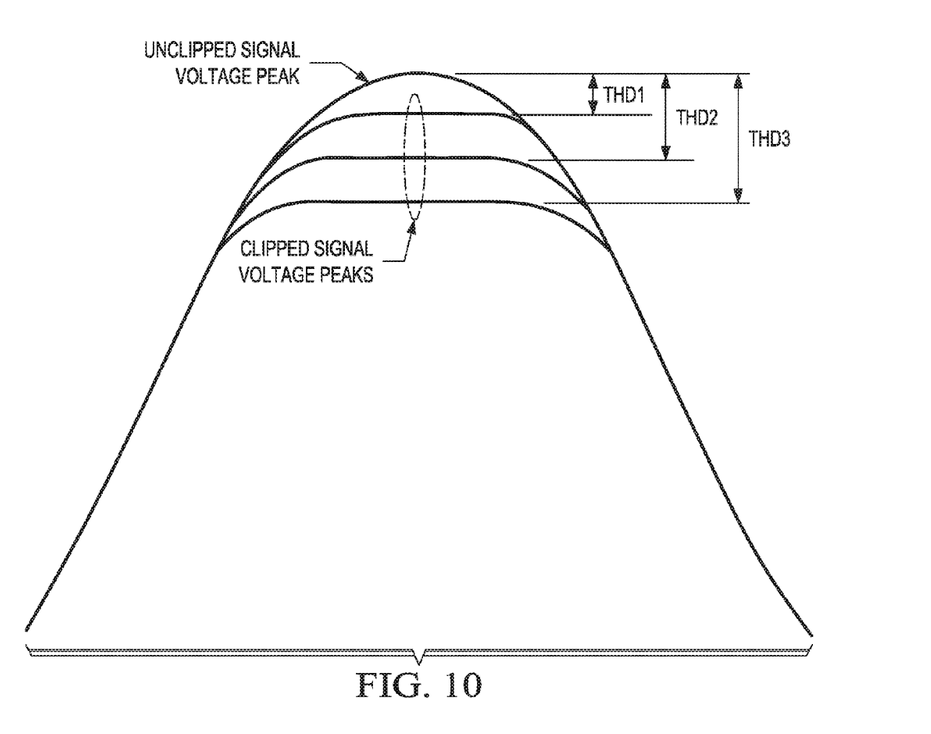
FIG. 10 illustrates a graph of a high-magnitude sinusoidal audio signal with three levels of total harmonic distortion, in accordance with embodiments of the present disclosure.
Figure 11:
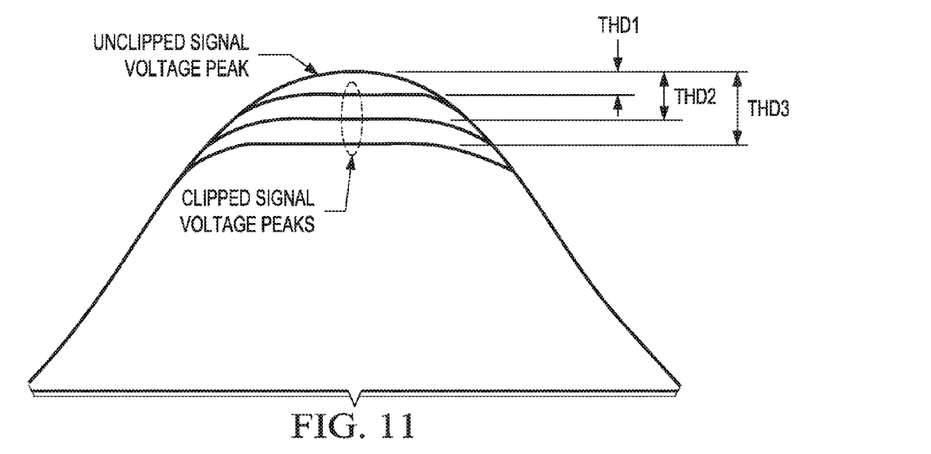
FIG. 11 illustrates a graph of a high-magnitude sinusoidal audio signal with three levels of total harmonic distortion, in accordance with embodiments of the present disclosure.

However, audio clipping prevention subsystem 105 may be configured to dynamically adapt an amount of headroom in order to maintain a targeted level of audio quality while maximizing the output power delivered to the load under all operational conditions. To illustrate such operation, reference is made to FIGS. 10 and 11 which provide an example of a sinusoidal audio output signal $V_{OUT}$, in which audio distortion is approximately two times the percentage of the target THD. For example, for a five-volt peak-to-peak sine wave with a target of 10% THD, sinusoidal audio output signal $V_{OUT}$ would comprise approximately 0.1 V of amplifier clipping. Stated as an equation form:

Allowable audio clipping(V))/(Sine wave peak (V))≈2×Target THD(%)

FIGS. 10 and 11 provide an example of this effect using two different signals with two different signal amplitudes. Three example distortion values are given for each waveform: THD1, THD2, and THD3. The labeled distortions on each waveform are equivalent to each other from a percentage standpoint. However, the voltage amplitude difference between the unclipped peak and the peaks for each of the three distortion values is reduced as the signal is reduced. This means that in order to produce a control mechanism that actually allows a configurable amount of pre-defined clipping, that the signal amplitude must be taken into account when calculating an output distortion limit and an acceptable amount of clipping.

However, attenuation control by audio clipping prevention subsystem 105 may not be as simple as using a fixed ratio between the desired THD and the amount of an allowable clipping voltage. Additional factors may be required to be taken into account when determining how much clipping from a voltage standpoint equates to signal distortion at the load. Without taking these factors into account, an error in calculating how much signal manipulation is necessary to produce a given output THD may occur. These allowable clipping compensation factors may include, but are not limited to: signal frequency content and its potential harmonics, amplifier output impedance, load impedance, signal path losses, an amplifier's modulation index, and the behavior of the amplifier around the signal transition between clipping and not clipping. The signal distortion that is produced at the load (e.g., versus the output of the amplifier or an intermediate point) may ultimately be what matters when allowing a controlled amount of electrical distortion for an audio system.

Most audio systems are concerned with a 20 Hz-20 kHz measurement bandwidth (e.g., corresponding to human auditory range). As audio clipping prevention subsystem 105 is intended to control and limit the output signal to operate within a targeted amount of signal distortion, audio clipping prevention subsystem 105 may need to take the frequency effects of the harmonics into account. Negating any secondary effects of amplifier 107, the THD of a clipped output signal may be dominated by its third harmonic. As long as the third harmonic resides within the measurement bandwidth, the THD may be within a fraction of a percent of the THD target. If the third harmonic of the signal is outside of the measurement bandwidth, the THD may be reduced significantly. Thus, for a single-tone sine wave analysis, step function reduction in THD is effectively produced at approximately 6.67 kHz (i.e. 20 kHz/3). However, most audio such as voice or music may include content across a broad spectral band and may not benefit from the harmonics residing outside of the measurement band. If the effect of the third harmonic exiting the measurement bandwidth is not taken advantage of, it simply means that for content where there is no lower frequency content present (e.g. <6.67 kHz), the total distortion level would be lower than targeted when measured against the measurement bandwidth (e.g. 20 Hz-20 kHz).

Amplifiers are not lossless and cannot achieve 100% modulation index relative to the supply voltage ($V_{BST}$). Often amplifiers have supply voltage headroom requirements. Depending on the type of amplifier, these can be a fixed (absolute) headroom requirement or a function of the ratio of the power supply voltage.

Even if the amplifier can utilize 100% of the available supply voltage when unloaded, adding a load may reduce the actual modulation index at the output of the amplifier itself. For example, if an 8-ohm load is being driven by a differential amplifier with a total output impedance of 400 mΩ (both outputs combined), at best the amplifier may be able to deliver approximately 95% of the supply voltage to the load due to losses in the amplifier. In order to calculate the allowable clipping voltage based on an input signal to the amplifier, the ability of the amplifier to gain up and reproduce the audio signal's amplitude accurately through the point of clipping must be taken into account.

In addition, connections between the amplifier and load itself are not lossless. Often in portable devices the signals have to go through additional connection points, and sometimes through series filtering components. The series impedance is negligible, but it is not uncommon that the connection and signal path impedances are in the order of an ohm or more. These losses further drive down the actual voltage delivered to the load. This does not have a significant impact on the signal amplitude at the output of the amplifier, but does impact the signal amplitude delivered to the load. A signal at the load is what any distortion component should be referenced to, and not the signal reproduced by the amplifier. Assuming signal path impedances are mostly linear within the audio band, these losses can be corrected in an open-loop feed-forward manner by compensating the allowable clipping voltage based on a ratio produced by a resistor divider of an output impedance of amplifier 107, the losses of the signal path, and the load of amplifier 107 relative to boost voltage $V_{BST}$. Alternatively, these losses can be corrected by monitoring the voltage delivered at the load and then compensating for the losses within an adaptive control algorithm.

An amplifier's clipping behavior and how it shapes the signal at the entry and exit of the point of clipping can either increase or decrease the THD. This shaping typically matters at lower distortion levels (e.g. <2% THD). In order to obtain a high output modulation index, some closed-loop Class D amplifiers may transition to an open-loop mode of operation around the point of signal clipping in order to maximize the signal swing relative to the power supply. As the audio signal reduces back down to a level where the amplifier can return to a closed-loop operation, the loop must recover or re-lock. This recovery or re-locking often has a behavior which reshapes the signal slightly. When operating at higher distortion levels, the effects of this recover are dwarfed by the clipping of the signal itself and can often be discounted. One way to compensate for this would be by adding an offset to the THD calculation where the offset decreases as the targeted THD increases.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A method, comprising:
   receiving information indicative of an amplitude of an audio output signal;
   receiving information indicative of a predicted voltage of a power supply of a signal path having an audio input for receiving an audio input signal and an audio output for generating the audio output signal based on the audio input signal;
   predicting from the information indicative of the amplitude of the audio output signal and the information indicative of the predicted voltage whether the audio output signal will exceed an available supply voltage generated by the power supply; and
   responsive to determining the audio output signal will exceed the available supply voltage generated by the power supply, attenuating the audio input signal or a derivative thereof to reduce the amplitude of the audio output signal such that the audio output signal does not exceed the available supply voltage of the power supply.

2. The method of claim 1, further comprising predicting the predicted voltage of the power supply based upon a magnitude of a supply voltage generated by the power supply and a rate of change of the magnitude of the supply voltage with respect to time.

3. The method of claim 1, further comprising:
   receiving information indicative of a maximum allowable distortion of the audio output signal; and
   predicting from the information indicative of the amplitude of the audio output signal, the information indicative of the predicted voltage, and the information indicative of the maximum allowable distortion whether the audio output signal will exceed the maximum allowable distortion.

4. The method of claim 3, further comprising attenuating the audio input signal or a derivative thereof across its frequency range to reduce the amplitude of the audio output signal such that the audio output signal does not exceed the available supply voltage of the power supply.

5. The method of claim 3, further comprising attenuating the audio input signal or a derivative thereof within a portion of its frequency range to reduce the amplitude of the audio output signal such that the audio output signal does not exceed the available supply voltage of the power supply.

6. The method of claim 5, further comprising determining a frequency bandwidth of the power supply by monitoring its rate of change and bounding the frequency portion of the frequency range to the frequency bandwidth.

7. A method, comprising:
   receiving information indicative of a first amplitude of a first audio output signal generated by a first amplifier integrated circuit based on a first audio input signal;
   receiving information indicative of a second amplitude of a second audio output signal generated by a second amplifier integrated circuit based on a second audio input signal;
   receiving information indicative of a condition of a power supply for supplying energy to each of the first amplifier integrated circuit and the second amplifier integrated circuit;
   predicting from the information indicative of the first amplitude, the information indicative of the second amplitude, and the information indicative of the condition whether at least one of the first audio input signal and the second audio input signal will exceed an available supply voltage generated by the power supply; and
   responsive to determining at least one of the first audio input signal and the second audio input signal will exceed the available supply voltage generated by the power supply, attenuating at least one of the first audio input signal or a derivative thereof and the second audio input signal or a derivative thereof such that the first audio output signal and the second audio output signal do not exceed the available supply voltage of the power supply.

8. The method of claim 7, wherein attenuating at least one of the first audio input signal or a derivative thereof and the second audio input signal or a derivative thereof comprises attenuating both of the first audio input signal or a derivative thereof and the second audio input signal or a derivative thereof.

9. The method of claim 8, wherein attenuating both of the first audio input signal or a derivative thereof and the second audio input signal or a derivative thereof comprises synchronizing attenuation of the first audio input signal or a derivative thereof and the second audio input signal or a derivative thereof.

10. The method of claim 7, wherein the condition of the power supply comprises a predicted voltage of the power supply, the method further comprising predicting the predicted voltage of the power supply based upon a magnitude of a supply voltage generated by the power supply and a rate of change of the magnitude of the supply voltage with respect to time.

11. An integrated circuit, comprising:
a first input configured to receive information indicative of an amplitude of an audio output signal;
a second input configured to receive information indicative of a predicted voltage of a power supply of a signal path having an audio input for receiving an audio input signal and an audio output for generating the audio output signal based on the audio input signal; and
processing circuitry configured to:
predict from the information indicative of the amplitude of the audio output signal and the information indicative of the predicted voltage whether the audio output signal will exceed an available supply voltage generated by the power supply; and
responsive to determining the audio output signal will exceed the available supply voltage generated by the power supply, attenuate the audio input signal or a derivative thereof to reduce the amplitude of the audio output signal such that the audio output signal does not exceed the available supply voltage of the power supply.

12. The integrated circuit of claim 11, wherein the processing circuitry is further configured to predict the predicted voltage of the power supply based upon a magnitude of a supply voltage generated by the power supply and a rate of change of the magnitude of the supply voltage with respect to time.

13. The integrated circuit of claim 11, further comprising:
a third input configured to receive information indicative of a maximum allowable distortion of the audio output signal; and
wherein the processing circuitry is further configured to predict from the information indicative of the amplitude of the audio output signal, the information indicative of the predicted voltage of the power supply, and the information indicative of the maximum allowable distortion of the audio output signal whether the audio output signal will exceed the maximum allowable distortion.

14. The integrated circuit of claim 13, wherein the processing circuitry is further configured to attenuate the audio input signal or a derivative thereof across its frequency range to reduce the amplitude of the audio output signal such that the audio output signal does not exceed the available supply voltage of the power supply.

15. The integrated circuit of claim 13, wherein the processing circuitry is further configured to attenuate the audio input signal or a derivative thereof within a portion of its frequency range to reduce the amplitude of the audio output signal such that the audio output signal does not exceed the available supply voltage of the power supply.

16. The integrated circuit of claim 15, wherein the processing circuitry is further configured to determine a frequency bandwidth of the power supply by monitoring its rate of change and bound the frequency portion of the frequency range to the frequency bandwidth.

17. An integrated circuit, comprising:
a first input configured to receive information indicative of a first amplitude of a first audio output signal generated by a first amplifier integrated circuit based on a first audio input signal;
a second input configured to receive information indicative of a second amplitude of a second audio output signal generated by a second amplifier integrated circuit based on a second audio input signal;
a third input configured to receive information indicative of a condition of a power supply for supplying energy to each of the first amplifier integrated circuit and the second amplifier integrated circuit; and
processing circuitry configured to:
predict from the information indicative of the first amplitude, the information indicative of the second amplitude, and the information indicative of the condition whether at least one of the first audio input signal and the second audio input signal will exceed an available supply voltage generated by the power supply; and
responsive to determining at least one of the first audio input signal and the second audio input signal will exceed the available supply voltage generated by the power supply, attenuate at least one of the first audio input signal or a derivative thereof and the second audio input signal or a derivative thereof such that the first audio output signal and the second audio output signal do not exceed the available supply voltage of the power supply.

18. The integrated circuit of claim 17, wherein attenuating at least one of the first audio input signal or a derivative thereof and the second audio input signal or a derivative thereof comprises attenuating both of the first audio input signal or a derivative thereof and the second audio input signal or a derivative thereof.

19. The integrated circuit of claim 18, wherein attenuating both of the first audio input signal or a derivative thereof and the second audio input signal or a derivative thereof comprises synchronizing attenuation of the first audio input signal or a derivative thereof and the second audio input signal or a derivative thereof.

20. The integrated circuit of claim 17, wherein the condition of the power supply comprises a predicted voltage of the power supply, and wherein the processing circuit is further configured to predict the predicted voltage of the power supply based upon a magnitude of a supply voltage generated by the power supply and a rate of change of the magnitude of the supply voltage with respect to time.

* * * * *